(12) United States Patent
Chakrapani et al.

(10) Patent No.: US 7,687,913 B2
(45) Date of Patent: Mar. 30, 2010

(54) RECOVERY OF HYDROPHOBICITY OF LOW-K AND ULTRA LOW-K ORGANOSILICATE FILMS USED AS INTER METAL DIELECTRICS

(75) Inventors: Nirupama Chakrapani, Chandler, AZ (US); Matthew E. Colburn, Hopewell Junction, NY (US); Christos D. Dimitrakopoulos, Baldwin Place, NY (US); Dirk Pfeiffer, Dobbs Ferry, NY (US); Sampath Purushothaman, Yorktown Heights, NY (US); Satyanarayana V. Nitta, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 11/676,447

(22) Filed: Feb. 19, 2007

(65) Prior Publication Data

US 2007/0138640 A1     Jun. 21, 2007

Related U.S. Application Data

(62) Division of application No. 10/853,771, filed on May 25, 2004, now Pat. No. 7,179,758.

(60) Provisional application No. 60/499,856, filed on Sep. 3, 2003.

(51) Int. Cl.
*H01L 23/48* (2006.01)
*H01L 23/52* (2006.01)
*H01L 29/40* (2006.01)

(52) U.S. Cl. .............. 257/758; 257/E21.242; 257/E21.261; 257/774

(58) Field of Classification Search ............ 257/758, 257/759, 760, 774, E21.242, E21.261, E21.579
See application file for complete search history.

(56) References Cited

U.S. PATENT DOCUMENTS

| | | | |
|---|---|---|---|
| 6,318,124 B1 | 11/2001 | Rutherford et al. | |
| 6,448,331 B1 | 9/2002 | Ioka et al. | |
| 6,673,521 B2 | 1/2004 | Moreau et al. | |
| 6,737,118 B2 | 5/2004 | Yamada et al. | |
| 7,029,826 B2 | 4/2006 | Hacker et al. | |
| 2002/0168876 A1 | 11/2002 | Endisch et al. | |

(Continued)

FOREIGN PATENT DOCUMENTS

WO     WO 00/44036     7/2000

OTHER PUBLICATIONS

Ki-Ho Baik et al., Comparative study between gas- and liquid-phase silyation for the diffusion-enhanced silylated resist process, J. Vac. Sci. Technol. B9(6), pp. 3399-3405, Nov./Dec. 1991.

(Continued)

*Primary Examiner*—Walter L Lindsay, Jr.
(74) *Attorney, Agent, or Firm*—Daniel P. Morris; David Aker

(57) ABSTRACT

Often used to reduce the RC delay in integrated circuits are dielectric films of porous organosilicates which have a silica like backbone with alkyl or aryl groups (to add hydrophobicity to the materials and create free volume) attached directly to the Si atoms in the network. Si—R bonds rarely survive an exposure to plasmas or chemical treatments commonly used in processing; this is especially the case in materials with an open cell pore structure. When Si—R bonds are broken, the materials lose hydrophobicity, due to formation of hydrophilic silanols and low dielectric constant is compromised. A method by which the hydrophobicity of the materials is recovered using a novel class of silylation agents which may have the general formula $(R_2N)_X SiR'_Y$ where X and Y are integers from 1 to 3 and 3 to 1 respectively, and where R and R' are selected from the group of hydrogen, alkyl, aryl, allyl and a vinyl moiety. Mechanical strength of porous organosilicates is also improved as a result of the silylation treatment.

8 Claims, 7 Drawing Sheets

→ 1220

U.S. PATENT DOCUMENTS

| | | |
|---|---|---|
| 2003/0054667 A1 | 3/2003 | Yau et al. |
| 2004/0018452 A1 | 1/2004 | Schilling |
| 2004/0087135 A1 | 5/2004 | Canaperi et al. |
| 2004/0152296 A1* | 8/2004 | Matz et al. .................. 438/623 |

OTHER PUBLICATIONS

Bo Xie et al., Silyation of porous methylsilsesquioxane films in supercritical carbon dioxide, Microelectronic Engineering, Elsevier, available online Aug. 4, 2004, published on paper Oct. 2004.

D. Padhi et al., Planarization of Copper Thin Films by Electropolishing in Phosphoric Acid, J. Electrochem. Soc., 150 (1) pp. G10-G14 (2003).

S. S. Prakash et al., Silica aerogel films prepared at ambient pressure by using surface derivatization to induce reversible drying shrinkage, Nature, vol. 374, pp. 439-443, (Mar. 1995).

T.C. Chang et al., Recovering Dielectric Loss of Low Dielectric Constant Organic Siloxane during the Photoresist Removal Process, J.Electrochem.Soc.,149(8)F81-84.

V.M. Gun'ko et al., Mechanism and Kinetics of Hexamethyldisilazane Reaction with Fumed Silica Surface, J. of Colloid and Interface Science, 228, p. 157-170 (2000).

J. C. Hu et al., Self-organized Nanomolecular Films on Low-Dielectric Constant Porous Methyl Silsesquioxane at Room Temperature, J. Electrochem. Soc., 150 (4) pp. F61-F66 (2003).

* cited by examiner

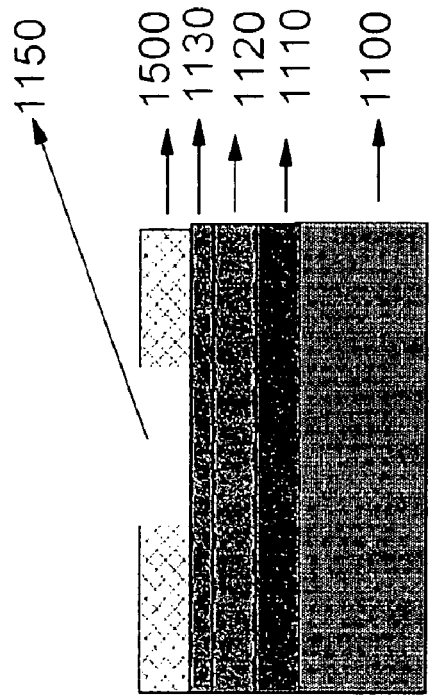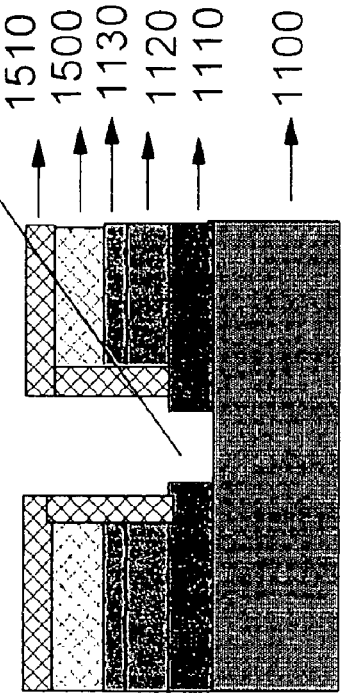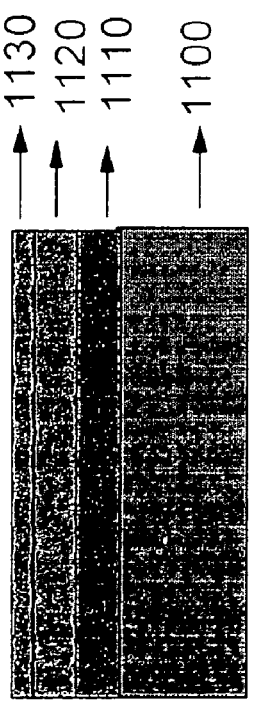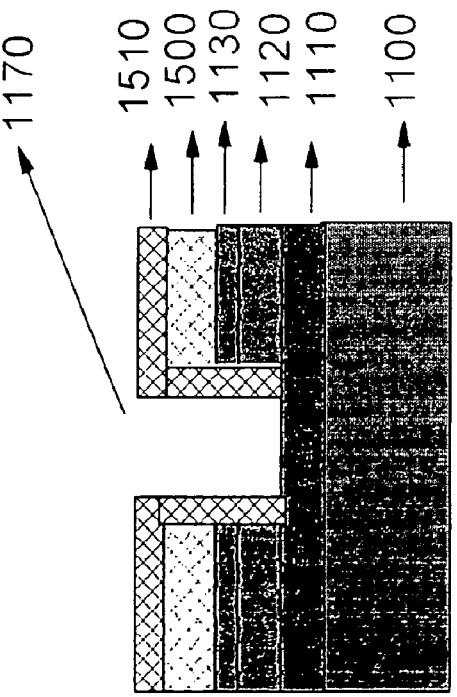
Figure 1a
Figure 1b
Figure 1c
Figure 1d

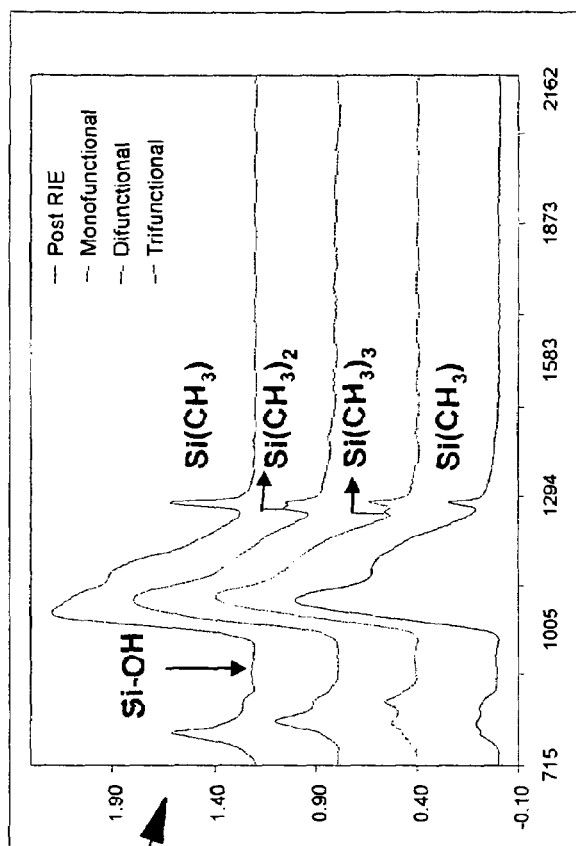
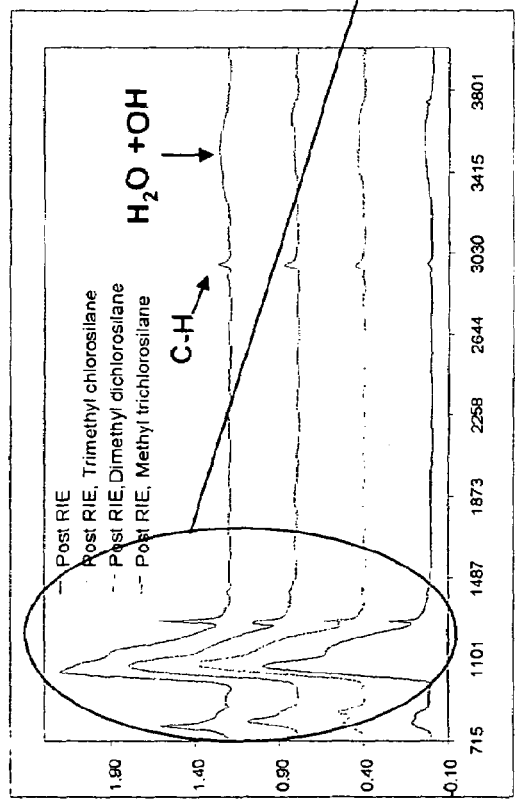
Figure 4a
Figure 4b

US 7,687,913 B2

RECOVERY OF HYDROPHOBICITY OF LOW-K AND ULTRA LOW-K ORGANOSILICATE FILMS USED AS INTER METAL DIELECTRICS

This application is a divisional of application Ser. No. 10/853,771 filed on May 25, 2004, and issued as U.S. Pat. No. 7,179,758, which in turn claims priority from Provisional Application Ser. No. 60/499,856 which was filed on Sep. 3, 2003.

FIELD OF THE INVENTION

This invention pertains to interconnect wiring networks on very high performance microelectronic chips used in computers, microprocessors, microcontrollers, sensors, communication devices and the like. In particular, the inventive structures described herein pertain to significantly reducing the signal propagation delay associated with these wires. The inventive methods detailed and claimed provide the chemistry and processing required to recover the dielectric properties of low dielectric constant dielectrics after they have been rendered hydrophilic by required plasma exposures and to the chemistry and method required to increase the mechanical strength, and maintain the low dielectric constant of porous organosilicate dielectrics after they have been deposited and during the process of building an interconnect structure comprising these films. This invention further pertains to methods which enable the successful integration of these materials into such chips.

BACKGROUND OF THE INVENTION

High performance microprocessor, microcontroller and communication chips require very high speed interconnects between the active transistor devices which are used to perform the various functions such as logical operations, storing and retrieving data, providing control signals, and the like. With progress in the transistor device technology leading to the present ultra large scale integration, the overall speed of operation of these advanced chips is beginning to be limited by the signal propagation delay in the interconnection wires between the individual devices on the chips. The signal propagation delay in the interconnects is dependent on the RC product wherein, R denotes the resistance of the interconnect wires and C represents the overall capacitance of the interconnect scheme in which the wires are embedded. Use of copper instead of aluminum as the interconnect wiring material has allowed the reduction of the resistance contribution to the RC product. The current focus in the microelectronics industry is to reduce interconnect capacitance by the use of lower dielectric constant (k) insulators in building the multi-layered interconnect structures on chips.

One prior art method of creating interconnect wiring network on such small a scale is the dual damascene (DD) process schematically shown in FIGS. 1a to 1g. Referring to FIG. 1a, In the standard DD process, an inter metal dielectric (IMD), shown as two layers 1110, 1120 is coated on the substrate 1100. The via level dielectric 1110 and the line level dielectric 1120 are shown separately for clarity of the process flow description. In general, these two layers can be made of the same or different insulating films and in the former case applied as a single monolithic layer. A hard mask layer or a layered stack 1130 is optionally employed to facilitate etch selectivity and to serve as a polish stop. The wiring interconnect network consists of two types of features: line features that traverse a distance across the chip, and the via features which connect lines in different levels of interconnects in a multilevel stack together. Historically, both layers are made from an inorganic glass such as silicon dioxide ($SiO_2$) or a fluorinated silica glass (FSG) film deposited by plasma enhanced chemical vapor deposition (PECVD).

Referring to FIG. 1b and FIG. 1c, in the dual damascene process, the position of the lines 1150 and the vias 1170 are defined lithographically in photoresist layers 1500 and 1510 respectively, and transferred into the hard mask and IMD layers using reactive ion etching processes. The process sequence shown in FIGS. 1a through 1d is called a "line-first" approach. After the trench formation, lithography is used to define a via pattern 1170 in the photoresist layer 1510 and the pattern is transferred into the dielectric material to generate a via opening 1180, as illustrated in FIG. 1d. The dual damascene trench and via structure 1190 is shown in FIG. 1e after the photoresist has been stripped.

As shown in FIG. 1f, the recessed structure 1190 is then coated with a conducting liner material or material stack 1200 that serves to protect the conductor metal lines and vias and serve as an adhesion layer between the conductor and the IMD. This recess is then filled with a conducting fill material 1210 over the surface of the patterned substrate. The fill is most commonly accomplished by electroplating of copper although other methods such as chemical vapor deposition (CVD) and other materials such as aluminum or gold can also be used. The fill and liner materials are then chemical-mechanical polished (CMP) to be coplanar with the surface of the hard mask and the structure at this stage is shown in FIG. 1f. A capping material 1220 is deposited as a blanket film, as is depicted in FIG. 1g to passivate the exposed metal surface and to serve as a diffusion barrier between the metal and any additional IMD layers to be deposited over them. Silicon nitride, silicon carbide, and silicon carbonitride films deposited by PECVD are typically used as the capping material 1220. This process sequence is repeated for each level of the interconnects on the device. Since two interconnect features are simultaneously defined to form a conductor inlaid within an insulator by a single polish step, this process is designated a dual damascene process.

In order to lower the capacitance, it is necessary to use lower k dielectrics such as PECVD or spin-on organo-silicates which have k values in the 2.5 to 3.1 range instead of the PECVD silicon dioxide based dielectrics (k=3.6 to 4.1). These organosilicates have a silica like backbone with hydrogen and/or organic groups such as alkyl or aryl groups attached directly to the Si atoms in the network. Their elemental compositions generally consist of Si, C, O, and H in various ratios. The C and H are most often present in the form of methyl groups (—$CH_3$). The primary function of these methyl groups is to add hydrophobicity to the materials. A secondary function is to create free volume in these films and reduce their polarizability. The k value can be further reduced to 2.2 (ultra low k) and even below 2.0 (extremely low k) by introduction of porosity in these insulators. For the purpose of brevity, these ultra low k and extreme low k materials will be referred to collectively as very low k materials in this document.

Although a tunable range of k values is possible with this set of very low k materials, there are several difficulties in integrating these materials with copper interconnects by the dual damascene process described above or by any other variation of the dual damascene process. The chief difficulty is that the organosilicate-based materials are very sensitive to plasma exposures because of the relative ease of oxidation or cleavage of the Si-organic group linkage (for example, Si-methyl) which results in formation of silanol (Si—OH)

groups in the film through a potential reaction with moisture in the ambient environment. Silanols absorb water and hence increase the dielectric constant and the dielectric loss factor of the film significantly, thus negating the performance benefits expected from the very low k films. They also increase the electrical leakage in the film and thus create a potentially unreliable interconnect structure. Since reactive ion etch and plasma etch are key steps required in the formation of the dual damascene trench and via structure as described above, and in the removal of photoresists used in patterning the very low k materials, it is very difficult, if not impossible, to avoid plasma damage of this class of films during a prior art dual damascene integration.

Several attempts have been made to minimize the loss of hydrophobicity in the low k films using non-oxidizing resist strip plasmas consisting of some or all of He, $H_2$, $N_2$, CO etc. However, it must be noted that none of these plasma chemistries completely succeed in preventing the loss of hydrophobicity of the very low k materials. This is especially the case for porous low k materials which have a very large surface area and are easily susceptible to damage during the resist strip processes.

Another method to prevent the low k material from losing its hydrophobicity and its dielectric properties is the use of fluorinated or non-fluorinated organic polymer based low k materials such as Dow Chemical's SiLK™ dielectric, Honeywell's Flare™ and other polyimides, benzocyclobutene, polybenzoxazoles, aromatic thermoset polymers based on polyphenylene ethers; and chemical vapor deposited polymers such as poly paraxylylene which are not susceptible to damage during traditional process plasma exposures associated with the dual damascene processing. However, these materials do not possess the other properties required of a low k dielectric film such as a low thermal expansion and small pore sizes.

Another problem facing the successful integration of organosilicate-based porous materials is that they are very fragile mechanically due to their low elastic modulus, fracture toughness and hardness which often lead to failures in CMP, dicing and packaging operations. The mechanical strength of these resins depends on both the void volume as well as their chemical structure. Their mechanical strength decreases with increasing porosity as well as increasing cage-like structure of the siloxane backbone. Since it is imperative that a low dielectric constant be maintained, it is very difficult to decrease the void volume while maintaining the same mechanical strength.

Several methods (Padhi et al., *J. Electrochem. Soc.,* 150 (1), G10-G14, (2003), and United States patent application publication US2004/0087135 A1 of Canaperi et al., assigned to the same assignee as that of the present invention) have been proposed to handle porous organosilicate materials with weak mechanical strengths but most of these methods are difficult to implement due to the fact that these methods either involve a nonstandard process flow or a nonstandard tool. Therefore they are expensive to implement in production.

In the literature on porous silica based films, (For example, Prakash et al., Nature, 374, 439, (1995)), surface modification to introduce hydrophobic end groups during film formation is accomplished by means of a wet chemical treatment wherein the silylating agent (Tri-methyl chloro silane—TMCS) is introduced into the porous network by means of a low surface tension carrier solvent. Such a reaction, called silylation, is feasible for films that are in the process of forming since there is a great deal of free volume and an abundance of silanols that would otherwise condense and bridge. Thus far, it is not clear whether a similar reaction can be performed on fully formed films which, even after exposure to process chemistries that damage the film, have fewer silanols than the films that are in the process of forming. There have been studies published by Chang et. al., (J. Electrochem Soc., 149, 8, F81-F84, 2002) where an attempt has been made to recover the hydrophobicity and the carbon content of the porous OSG film after damage using hexamethy disilazane (HMDS) as the silylating agent. However, it is clear from their results that HMDS in any medium is unable to recover, completely, the properties of the porous OSG film. Similarly, TMCS is not completely effective at recovering the dielectric properties either. Both HMDS and TMCS are monofunctional silylating agents with the ability to attack only a single isolated silanol group per molecule on the surface and pore wall of the low k material. However, organosilicate based low k materials have two distinct types of silanols which are classified as follows (Gun'ko et al., J. Colloid and Interface Sci 228, 157-170 (2000)): The first type of silanol is the non-hydrogen bonded silanol which in itself consists of, (1) completely non-interacting single silanols (also called isolated silanols) which do not have any neighboring silanols nearby, (2) very weakly interacting silanols, and (3) weakly and non-interacting geminal silanols (also called disilanol). The second type of silanol is the hydrogen bonded silanol. Most monofunctional silylation agents attack and replace the isolated silanols readily, but generally do not attack the other two types of non-hydrogen bonded silanols as readily. The primary reason for this is that steric hindrance prevents the simultaneous capture of more than one silanol with a monofunctional silylating agent readily. Additionally, it is also important to use a silylating agent with the most reactive functionality to readily silylate the surface and pore walls of the low k material without releasing a byproduct of the reaction that is corrosive.

Hu et al., (J. of Electrochem. Soc., 150 (4) F61-F66 (2003)) have also published a study where they examine the efficacy of dimethyldichloro silane (DMDCS) as a silylating agent to recover the properties of low k materials. However, in their study, they report that dimethyldichloro silane forms a monolayer on the top surface of the film and does not penetrate the bulk of the porous low k material. Thus, unless the appropriate silylating medium as well as conditions for the silylation are used, it is difficult to recover the bulk dielectric properties of the low k material. Additionally, the byproduct of any chlorine based silylating agent such as dimethyldichloro silane and TMCS is hydrogen chloride, which is corrosive and cannot be used in interconnect structures that contain copper.

SUMMARY OF THE INVENTION

It is therefore an aspect of the present invention to provide a low cost, non-disruptive method to increase the mechanical strength by altering the cage to network ratio of the porous organosilicate resin after the deposition and cure.

It is therefore an object of this invention to provide a class of silylating agents as well as a process flow to utilize them by means of which the hydrophobicity of the materials is recovered completely post process exposure without yielding a corrosive byproduct.

It is a further object of this invention to provide a method by which the silylating agents of this invention can be introduced such that they penetrate the bulk of the porous low k material and recover the properties.

It is a further object of the invention to alter the chemistry of resins post deposition and pore formation to increase the mechanical strength and overcome some of the chief obstacles facing the successful integration of porous organosilicates.

The method by which the cage-network ratio is altered in this invention is also by silylation which introduces new network forming siloxane bonds into the film and hence improves mechanical properties without a significant increase in dielectric constant. However, for the silylation reaction to work, it is necessary for the organosilicate film to have an abundance of silanols. Providing these silanols prior to silylation and ensuring that the silylation reaction occurs to a sufficient extent to strengthen this film is also an object of this invention.

An advantage of this invention is that the material choice for ultra low k intermetal dielectrics need not be constrained by a consideration of the effects of plasma and wet cleaning damage to these materials because they can be restored to their original properties after they have been damaged by employing the silylation methods taught in the present invention. Further, the availability of a reliable method to recover the properties of films damaged by plasma exposures allows more process options in the reactive ion etch (RIE) and resist strip operations required in the dual damascene build and can in turn result in more robust and lower cost processing. Finally, this invention provides a method to increase the mechanical robustness of the porous organosilicate films to be used as IMD's.

Thus, the invention is directed to a method for restoring properties of a low k or very low k dielectric constant organosilicate film having hydrogen atoms or alkyl or aryl groups attached to silicon atoms, and used in a low very low dielectric constant as an insulating layer in a semiconductor chip, or chip carrier, or a semiconductor wafer wherein the organosilicate film has undergone processing tending to degrade its the properties. The method comprises applying to the film a silylating agent comprising an aminosilane, so as to render the film hydrophobic. The aminosilane may have the general formula $(R_2N)_X SiR'_Y$ where X and Y are integers from 1 to 2 and 2 to 1 respectively, and where R and R' are selected from the group consisting of hydrogen, alkyl, aryl, allyl, phenyl and a vinyl moiety. Preferably, the aminosilane is bis(dimethylamino)dimethylsilane.

The aminosilane may have the general formula $(R_2N)_X SiR'_Y R''_Z$ where X, Y and Z are integers from 1 to 3, 3 to 1 and 1 to 3 respectively, and where R, R', and R'' are any hydrogen, alkyl, or aryl, allyl, phenyl or vinyl moiety.

The invention is also directed to the same general method comprising applying to the film a silylating agent, so as to render the film hydrophobic, said silylating agent having the form $R_X H_Y Si-A$ where X and Y are integers from 0 to 2 and 3 to 1, respectively and where R, is any hydrogen, alkyl, or aryl, allyl, phenyl or vinyl moiety and where A is a silazane, chloro, amino or alkoxy moiety. The silylating agent may comprise amino, chloro and alkoxy terminated monofunctional terminated silylating agent, wherein methyl moieties on the silylating agent are at least partially replaced by hydrogen analogues. The silylating agent may also comprise a polymeric siloxane with amino, alkoxy, chloro or silazane terminated end groups. The end groups of the polymeric siloxanes may comprise mono or di alkyl, aryl, vinyl or hydrogen moieties. The siloxane may comprise amino terminated polydimethylsiloxane.

The silylating agent also may have the general formula $R_X H_Y Si_Z A$ where X, and Y, are integers from 0 to 5, and 6 to 1 respectively and Z is equal to, 1 to 2 and where R is a hydrogen, alkyl, aryl, allyl, phenyl or vinyl moiety, and A is a silazane, chloro, amino or alkoxy moiety.

In accordance with the invention, the processing may include etching of the film, and removing a photoresist material from the film, wherein the silylating agent is applied after the etching and the removing. The etching and removing may be performed by exposing the film to a plasma. Single damascene or a dual damascene processing may be used, and the applying of the silylating agent may be performed after definition of at least one of an interconnect line and a via, and prior to deposition of an electrical conductor. Applying of the silylating agent is performed prior to deposition of a conductive liner.

The silylating agent may be applied by one of spin coating a liquid, immersing the substrate in a liquid, spray coating the substrate with the liquid, in a vapor phase, or dissolved in super critical carbon dioxide, preferably with a co-solvent selected from the group comprising at least one of alkanes, alkenes, ketones, ethers, and esters. Significantly, the silylating agent is applied in an absence of moisture. The film may be annealed, preferably at a temperature of at least 350° C., or as high as 450° C. for a period in excess of one minute. The annealing may be performed before or after applying the silylating agent. The silylating agent is preferably applied at a temperature of at least 25° C. The annealing is performed to facilitate at least one of condensing unsilylated silanols in the film, and forming additional siloxane bonds.

The silylating agent may be dissolved in a solvent, including a non-polar organic solvent with low surface tension selected from the group comprising alkanes, alkenes, ketones, ethers, esters, or any combinations thereof. Preferably, the solvent has a low enough surface tension so as to penetrate pores in the film. The silylating agent may preferably have a concentration of between two percent and ten percent by weight in the solvent, but may also have a concentration of as low as one half percent or greater by weight in the solvent.

The silylating agent may be applied for a period of time between one minute and one hour, at room temperature or higher. Agitation or ultrasonification may be utilized when the silylating agent is applied. The film may be rinsed to remove excess silylating agent. The film may be baked, preferably at a temperature of up to 450° C.

The silylating agent may be applied in a vapor phase, at temperatures between room temperature and 450° C., for a duration of thirty seconds to one hour, or of substantially 250° C., for a duration of five minutes. The silylating agent may be applied in super critical carbon dioxide, at temperatures between 25° C. and 450° C., at a pressure between 1000 and 10,000 psi, for a duration of thirty seconds to one hour. It may also be applied in super critical carbon dioxide or vapor media at temperature in excess of 75° C. for times in excess of 30 seconds.

The silylating agent is preferably difunctional. It may comprise comprises (Bis)dimethylaminodimethylsilane or (Bis) dimethylaminomethylsilane.

The step of applying the silylating agent follows treatment of the film with one of ultraviolet radiation, exposure to ozone, or exposure to a mildly oxidizing plasma or combinations thereof that introduces silanols into the film. The method may be carried out in a chemical vapor deposition chamber, or an atomic layer deposition chamber.

The properties that are restored by the method in accordance with the invention include at least one of hydrophobicity, elastic modulus, low dielectric constant, fracture toughness and hardness. The interconnect structure in which such a restored film is integrated may additionally include one or more intermetal dielectrics selected from the group consisting of silicon dioxide, fluorinated tetraethyl orthosilicate, fluorinated silica glass, fluorinated or non-fluorinated organic polymers, thermoset polymers, and chemical vapor deposited polymers. The thermoset polymers may be based on polyphenylene ethers. The chemical vapor deposited polymer may be poly paraxylylene. The additional intermetal dielectrics may be an organic polymers selected from the group of polyimides, benzocyclobutene, polybenzoxazoles, aromatic.

The invention is also directed to an article of manufacture comprising an insulating material having a plurality of electrical conductors formed therein; and an intermetal dielectric including an organosilicate film having hydrogen atoms or alkyl or aryl groups attached to silicon atoms; a surface of the organosilicate film comprising a product of the reaction between one of the silylating agents mentioned in the methods set forth above, and the organosilicate film. The article may be configured as a semiconductor chip, a semiconductor chip carrier or a semiconductor wafer. The surface may be an external surface of the film or that of pores within the film.

BRIEF DESCRIPTION OF THE DRAWINGS

These and other aspects, features, and advantages of the present invention will become apparent upon further consideration of the following detailed description of the invention when read in conjunction with the drawing figures, in which:

FIG. 1a to FIG. 1g illustrate process flow for a standard dual damascene integration scheme;

FIG. 4a shows a series of FTIR spectra illustrating the effect of mono, di and tri functional silylation agents;

FIG. 4b is an enlarged potion of FIG. 4a.

DESCRIPTION OF THE INVENTION

Variations described for the present invention can be realized in any combination desirable for each particular application. Thus particular limitations, and/or embodiment enhancements described herein, which may have particular advantages to the particular application need not be used for all applications. Also, it should be realized that not all limitations need be implemented in methods, systems and/or apparatus including one or more concepts of the present invention.

The primary embodiment of this invention (hereinafter "embodiment 1") pertains to the use of a novel class of silylating agents which are very effective silylating agents for recovery of dielectric properties. Further, embodiment 1 of this invention also pertains to a method by which these silylation agents are introduced into the process to ensure that the external surface, as well as the bulk (including all the interior pore walls), of the porous low k material are rendered hydrophobic. Finally, a second embodiment of this invention discloses specific molecular variations on moieties such as silazanes used in the prior art to render them more effective as silylating agents.

Figure 1F:
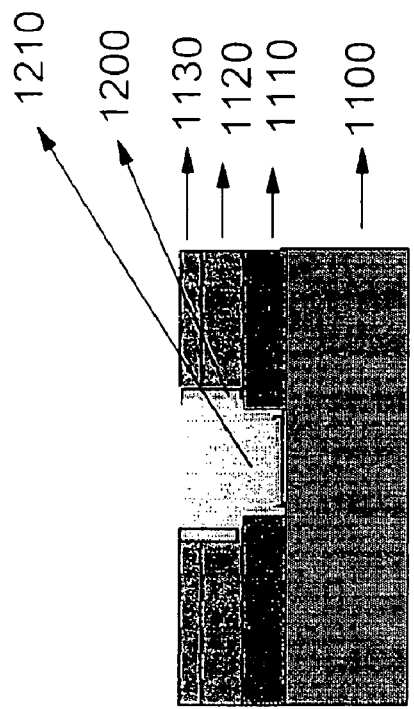
Figure 1E:
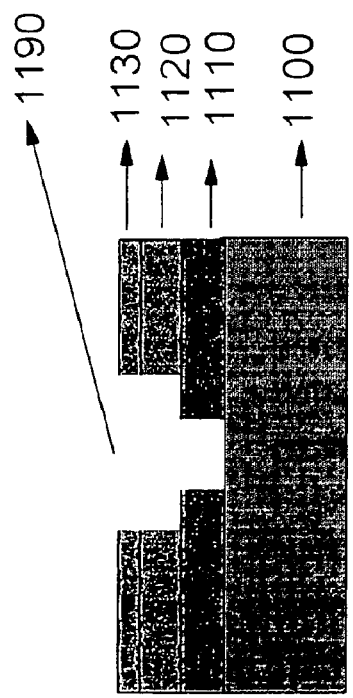
Figure 1G:
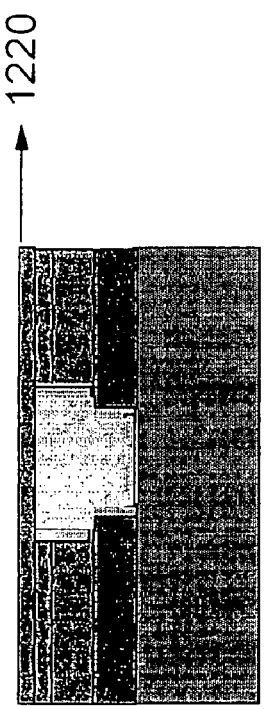

In embodiment 1 of this invention, the silylating agents of this invention are introduced into the single or dual damascene process for building an interconnect structure after the definition of the interconnect line and via and prior to the deposition of the conductive liner and fill materials which comprise the interconnect metal. Specifically, the silylating agents are introduced after the resist is stripped following the reactive ion etch (RIE) of the low k material. If a dual damascene scheme such as the one depicted in FIG. 1 is used, the silylating agent of the present invention is introduced between process steps of FIG. 1e and FIG. 1f. The silylating agents detailed in this invention can be used in interconnect structures which have dense or porous organosilicates at either the line or the via level or both. Further, they can be used in structures when porous organosilicates are used in combination with other organosilicates or with materials such as $SiO_2$, FSG, fluorinated tetraethyl orthosilicate (FTEOS), or fluorinated or non-fluorinated organic polymers. While the other materials listed may be part of the structure, they are generally not prone to damage of the kind described herein during processing and are thus not amenable to the silylation treatment, as such.

Figure 2:
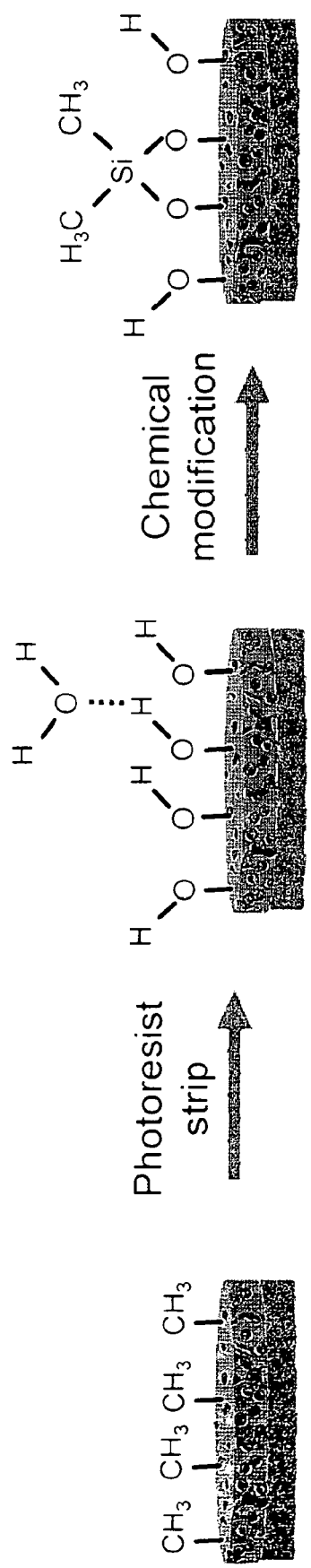
FIG. 2 is a schematic diagram illustrating the effect of plasma exposure and silylation on the chemistry of the very low k material.

The schematic in FIG. 2 demonstrates how the silylating agents used in this invention succeed in restoring the methyl moieties in the low k organosilicate films following their removal during typical process plasma exposures. The group of the silylating agent which leaves the reaction site (the "leaving group") is the group that reacts with and deprotonates the silanol forming a new siloxane bond. Thus, the reactivity of the leaving group determines the efficacy of the silylation reaction.

In embodiment 1 of this invention, a class of silylating agents which go by the general formula $(R_2N)_xSiR'_y$ where X and Y are integers from 1 to 2 and 2 to 1 respectively, are introduced after the definition of line and via that will subsequently hold the interconnect metal. In the above formula, R and R' could be any hydrogen, alkyl, aryl, phenyl, allyl or vinyl moiety that could render the film hydrophobic. These silylating agents are generally called aminosilanes and they will be referred to as such in the remainder of this document. They are termed monofunctional or difunctional depending upon the value of x being 1 or 2 respectively. The aminosilanes are introduced by a spin-on process, in liquid phase, in the vapor phase (in a furnace or in a CVD chamber), or supercritical carbon dioxide media, but in all cases, it is very important to handle the silylating agent in the total absence of ambient moisture, since any moisture that might be present could reduce the efficacy of the silylation reaction. Further, a combination of a silylation followed by an anneal or an anneal followed by a silylation or high temperature (preferably greater than 350° C.) silylation is preferred to silylation by itself, as this results in the greatest decrease of silanol content in the film. The anneal step also condenses any remaining unsilylated silanols in the film and enables the formation of additional siloxane bonds which strengthen the film.

When the aminosilanes are used in a liquid medium, they should preferably be dissolved in any non-polar organic solvent that has a low surface tension so that the pores can be penetrated effectively. Examples of such solvents include but are not limited to, hexanes, heptanes, xylenes, and the like. It is desirable but not necessary for the solvent to have a low volatility as measured by its flash point and boiling point. The concentration of the aminosilanes necessary for effective silylation can be as low as 0.5% by weight of the solution or the aminosilane can be used as such in its undiluted liquid form. The desired range for the most effective silylation is typically 2% to 10% in solution. The solution can either be spin coated on to the porous low k film or used in a wet chemical tank in which the wafers with the interconnect features defined in the porous low k film are immersed for a period ranging from 1 minute to 1 hour or more. The temperature for the silylation can either be room temperature or higher. Agitation or ultrasonification during the immersion is not necessary to facilitate the reaction but in some applications may help enhance the rate of the reaction. Following the silylation, the wafers can be rinsed off in the pure solvent and then baked on a hot plate or in a furnace to a temperature up to 450° C.

Liquid phase silylation can also be carried out by using the solution defined in the paragraph above and spin coating or spray coating this solution.

When a vapor phase silylation is carried out with the aminosilanes, it is important for the carrier gas to be inert and non-oxidizing and for the chamber to be moisture free. In case the chamber is not free of moisture, the di and tri functional amino silanes will tend to oligomerize and form either monolayers or films respectively. The formation of monolayers and films is not desirable because the reactivity of the silylating agents with the film in general will be slowed down; further the treatment will also be limited to the top surface and the pores in the bulk of the film will not be rendered hydrophobic. Vapor phase silylation can be carried out at temperatures ranging from room temperature to 450° C. for a duration ranging from 30 seconds to an hour or more. A preferable time and temperature for the vapor phase silylation is 5 minutes at 250° C. Following vapor phase silylation, an optional hot plate bake or a furnace cure up to a temperature of 450° C. can be employed. The vapor phase treatment of dielectric films can be performed in free standing furnaces, flow through chambers or in processing chambers used in semiconductor industry for chemical vapor deposition (CVD) or atomic layer deposition (ALD). The last two options are particularly attractive since these chambers are designed to handle the creation of a base vacuum to substantially exclude moisture, the introduction of vapor species and substrate heating and because the dielectric can be silylated in situ just prior to the interconnect metal deposition steps which can be readily done using CVD or ALD using appropriate vapor precursors.

When aminosilanes are introduced in a supercritical (SC) carbon dioxide ($CO_2$) medium, they can either be introduced by themselves or in combination with any suitable co-solvent. The temperature, pressure and time ranges for the SC $CO_2$ based silylation can be as follows: Temperature: 25° C. to 450° C., Pressure: 1,000 to 10,000 psi, Time: 30 seconds to 1 hour or more.

Figure 3A:
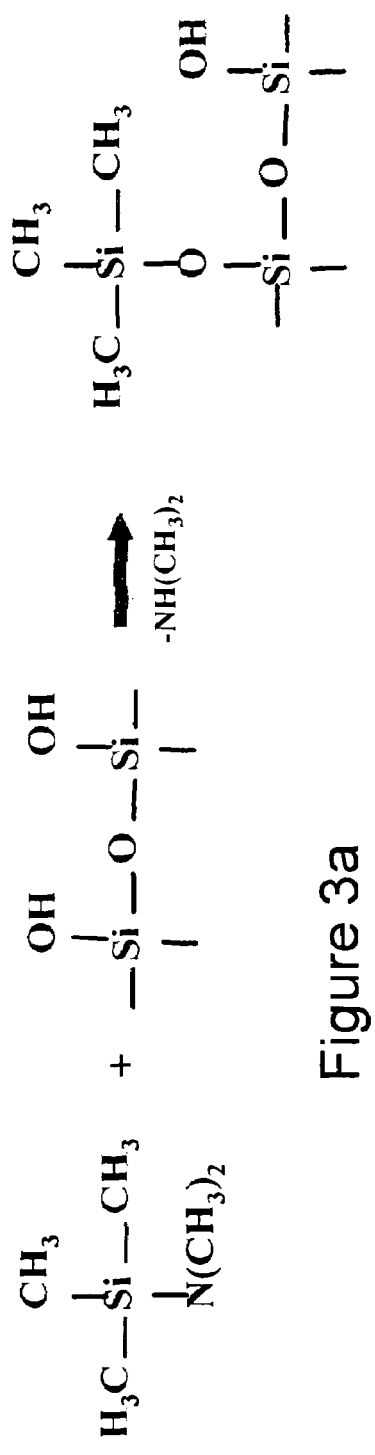
FIG. 3a is a schematic diagram showing how mono functional silylating agents capture only one isolated silanol and block the neighboring silanol.
Figure 3B:
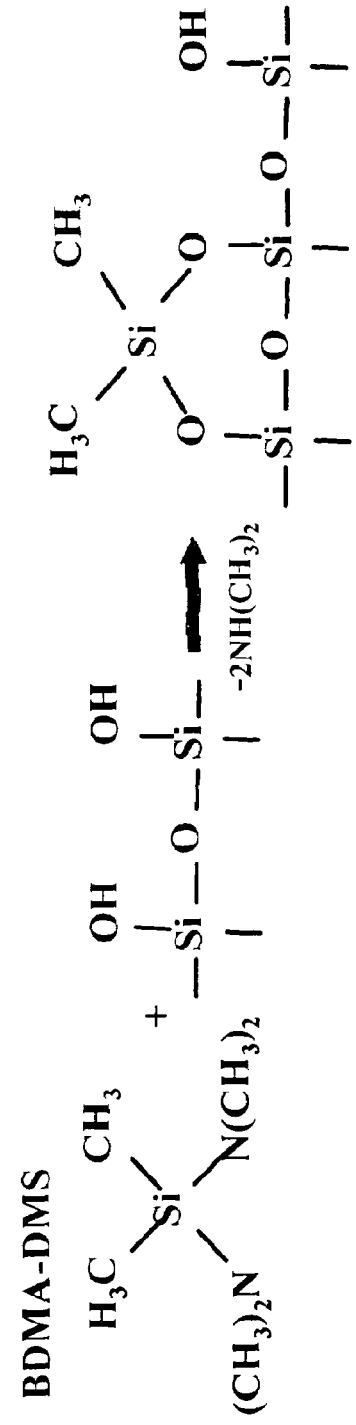
FIG. 3b is a schematic showing how the di functional analog of the agent used in 3a is successful at capturing two neighboring silanols simultaneously.

The use of a difunctional aminosilane such as (Bis)dimethylaminodimethylsilane (BDMADMS) or (Bis)dimethylaminomethylsilane in either SC $CO_2$ or vapor media at temperature in excess of 75° C. for times in excess of 30 s followed by a 400° C. anneal for periods in excess of 1 minute are preferred. Difunctional silylating agents are generally more effective than their monofunctional counterparts since they have a capacity to capture two neighboring non-hydrogen bonded silanols, especially geminal silanols simultaneously as shown in FIG. 3b (FIG. 3b shows two neighboring isolated silanols). Monofunctional silylating agents are generally unable to capture two neighboring silanols due to the three methyl moieties sterically hindering another monofunctional silylating agent from reacting readily with the neighboring silanol as shown in FIG. 3a. Trifunctional silylating agents have a tendency to cross-link and form films that do not penetrate the pores of a low k film. Additionally, due to the fact that it is not possible for trifunctional silylating agents to capture three silanols simultaneously, there is a possibility for additional silanol formation on the unreacted ends of the silylating agent.

FIG. 4 shows the comparison between mono, di and trifunctional chlorine terminated silylating agents where the silylation is performed in a moisture free environment in the liquid phase. From the FTIR spectra in FIG. 4, it can be seen that the difunctional agent shows the optimum combination of an increase in the methyl content of the film and a decrease in silanol content. A similar effect can be achieved with amino terminated silylation agents with the added benefit that the byproduct of the reaction is not corrosive.

Figure 5:
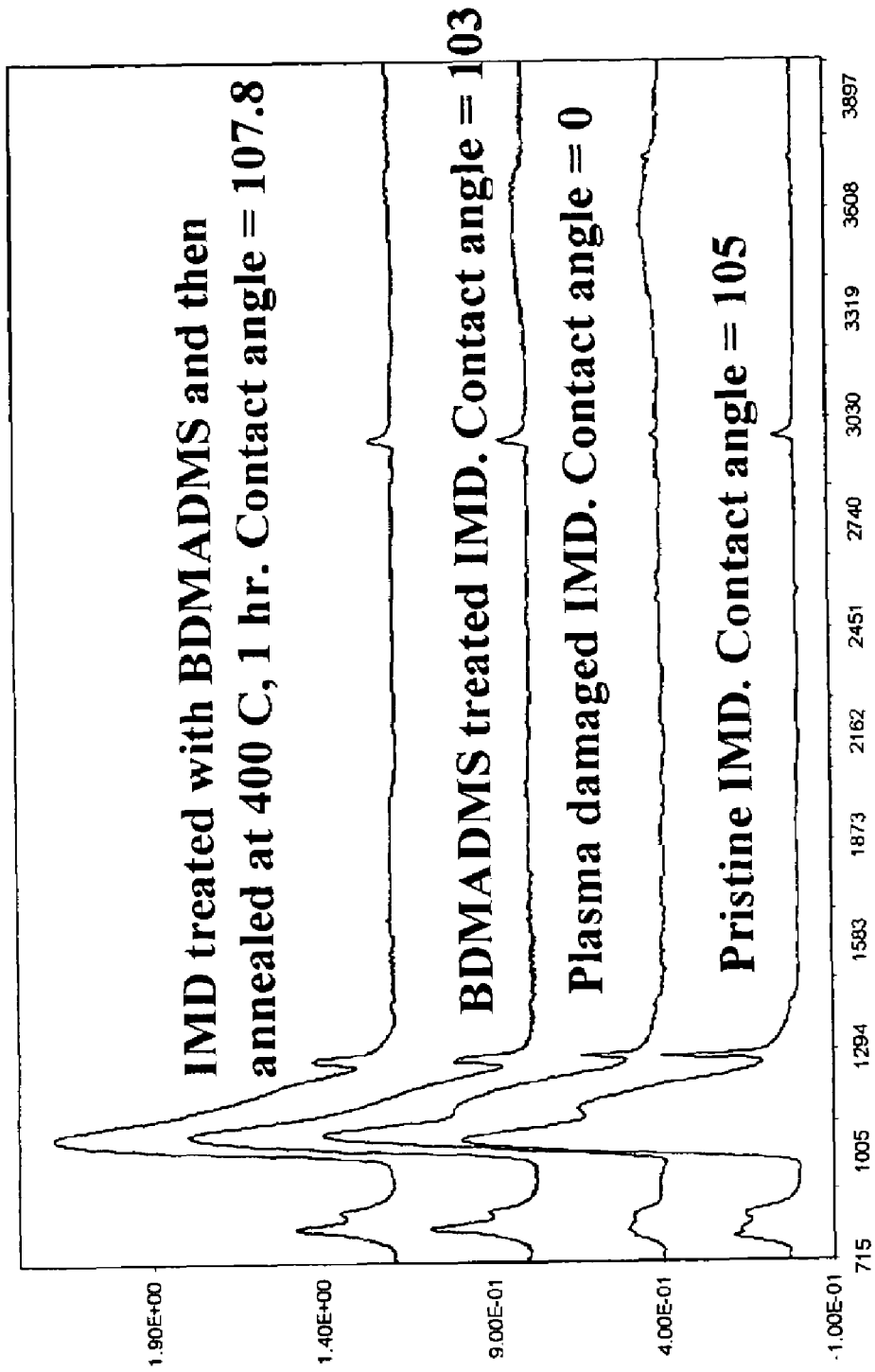
FIG. 5 provides comparisons of FTIR spectra and contact angle data of pristine, plasma damaged, BDMADMS treated and BDMADMS treated and annealed IMD.

As shown in FIG. 5, liquid phase silylation by BDMADMS followed by an anneal at 400° C. recovers the hydrophobicity and the methyl content of a porous low k film.

Tables 1A and 1B show a comparison of contact angles achieved by the preferred agent of this invention, BDMADMS, and that of the silylation agent HMDS used in the prior art. As can be seen from table 1A, BDMADMS is more effective in recovering the contact angle. Table 1B shows that the effect of BDMADMS is not diminished after 4 weeks of exposure to the ambient whilst the contact angle of the HMDS silylated low k material decreases showing a progressive deterioration in dielectric properties. Table 2 shows that BDMADMS recovers the k of the porous low k film after it increases post exposure to a typical process plasma. Similarly, the dielectric loss as well as the dielectric breakdown strength recover back to their original values for films treated with BDMADMS.

TABLE 1A

Immediately After Silylation

| TREATMENT | CONTACT ANGLE (degrees) |
|---|---|
| Pristine Film | 104 |
| Post Plasma Exposure | 0.5 |
| Post HMDS silylation + 400° C. anneal | 85 |
| Post BDMADMS silylation + 400° C. anneal | 107.8 |

TABLE 1B

Four Weeks After Silylation

| TREATMENT | CONTACT ANGLE (degrees) |
|---|---|
| Pristine Film | 104 |
| Post Plasma Exposure | 0 |
| Post HMDS silylation + 400° C. anneal | 81.3 |
| Post BDMADMS silylation + 400° C. anneal | 107.7 |

TABLE 2

| FILM/TREATMENT | DIELECTRIC CONSTANT |
|---|---|
| Pristine Film | 2.1 |
| Post Plasma Exposure + 400° C. anneal | 2.42 |
| Post BDMADMS silylation + 400° C. anneal | 1.95 |

Figure 6:
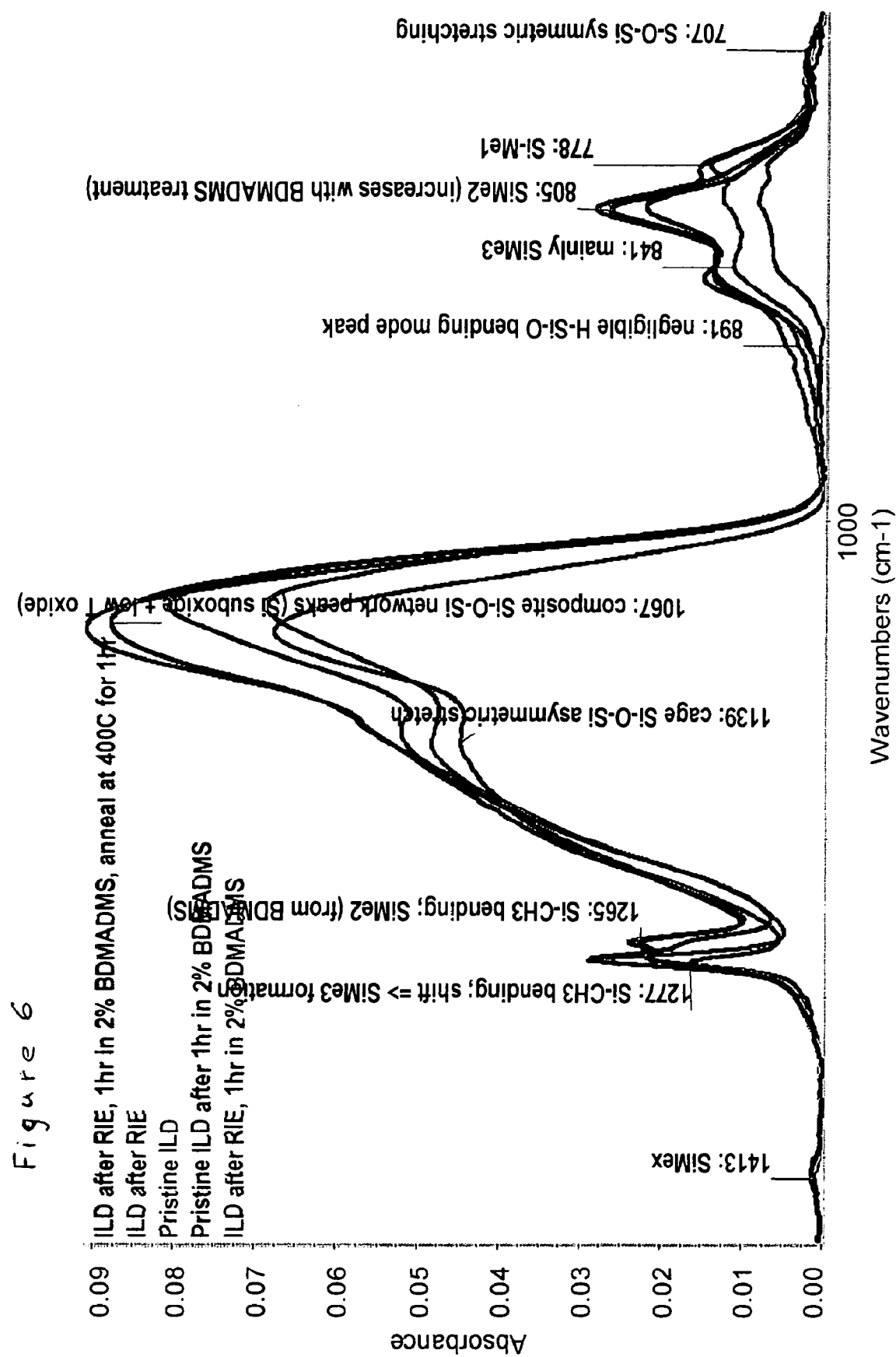
FIG. 6 is a graph of infrared absorbence as a function of wave number for pristine, plasma damaged, BDMADMS treated and BDMADMS treated and annealed porous organosilicate IMD.

It can be seen from FIG. 6 that silylation changes the structural morphology of the organosilicate and renders the backbone more network like rather than cage like, with the result that the mechanical properties are enhanced. This is due to the fact that the silylation reaction forms new network forming siloxane bonds which enhance the mechanical strength of the films. The infrared peak at a wave number of about 1067 (1/cm) which signifies the extent of the network structure in the film shows a marked increase in height with the silylation treatment as seen in the FTIR spectra in FIG. 6. Reference is made to Table 3.

TABLE 3

|  | Chlorosilane | Aminosilane | Alkoxysilane |
| --- | --- | --- | --- |
| LEAVING GROUP | HCL | $NHR_2$ | ROH |
| DISSOCIATION ENERGY $Me_3Si$—X (kcal/mol) | 117 | 98 | 123 |

As described above, the silylation reaction is followed by a furnace anneal to condense any remaining silanols and form new siloxane bonds that further enhance the mechanical strength.

Embodiment 2

Embodiment 1 shows the efficacy of difunctional silylation agents in general and BDMADMS in particular. Embodiment 1 also shows that monofunctional silylating agents such as HMDS and TMCS are not as effective as their difunctional counterparts due to the steric hindrance presented by the three methyl moieties on the silylating agent. However, through appropriately replacing the methyl moieties on the silylating agent with the smaller hydrogen moiety, it is possible to overcome this issue. For example, in place of HMDS, the use of tetramethyldisilazane (TMDS) will result in reduced steric hindrance and a more effective silylation reaction. Similarly greater success in silylation can be demonstrated with amino, chloro and alkoxy terminated mono functional silylation agents where the methyl moieties are at least partially replaced by their hydrogen analogs. Thus, silylating agents with the general formula $R_xH_ySi$-A where X and Y are integers from 0 to 2 and 3 to 1 respectively can be used as effective silylating agents. As described in the embodiment above, the silylation reaction is followed by a furnace anneal to condense any remaining silanols and form new siloxane bonds that further enhance the mechanical strength.

Embodiment 3

For applications where it is not necessary to penetrate the pores of the porous low k film, polymeric siloxanes with amino, alkoxy, chloro or silazanes terminated end groups with mono or di alkyl, aryl, vinyl or hydrogen moieties on them can be used to form monolayers on the top surface of the low k film and recover surface hydrophobicity. One example of such a siloxane is amino terminated polydimethylsiloxane. It is important to ensure that the molecular weight is low enough so that the silylating agent flows into the gaps created by the etch process to form trench and via in the organosilicate for the formation of the interconnect structure. As described in the embodiments above, the silylation reaction is followed by a furnace anneal to condense any remaining silanols and form new siloxane bonds that further enhance the mechanical strength.

Embodiment 4

The silylating agent can also be introduced immediately after the film is deposited. The efficacy in this case depends on how many silanols are present in the film after deposition. In this embodiment, the silylation agent can also be introduced following a treatment such as UV/Ozone, or a mildly oxidizing plasma exposure that introduces silanols into the film. As in previous embodiments, the silylation is followed by a thermal anneal. Silylating agents described in any of the above three embodiments can be employed in this manner. In the case of CVD deposited films, the silylation agent can be either co-deposited or introduced into the chamber along with the precursor for the CVD dielectric.

It is noted that the foregoing has outlined some of the more pertinent objects and embodiments of the present invention. The concepts of this invention may be used for many applications. Thus, although the description is made for particular arrangements and methods, the intent and concept of the invention is suitable and applicable to other arrangements and applications. It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments has been provided as an example and not as a limitation. The scope of the invention is defined by the appended claims.

The invention claimed is:

1. An article of manufacture comprising:
   an insulating material having a plurality of electrical conductors formed therein; and
   an intermetal dielectric including an organosilicate film having hydrogen atoms or alkyl or aryl groups attached to silicon atoms;
   a surface of the organosilicate film comprising a product of reaction with an aminosilane silylating agent and an organosilicate of said film, said aminosilane having the general formula $(R_2N)_xSiR'_yR''_z$ where X, Y and Z are integers with x varying from 1 to 3, and Y and Z varying from 3 to 0 respectively but where x+y+z is always equal to 4, and where R, R', and R" are any hydrogen, methyl, aryl, allyl, phenyl or vinyl moiety.

2. An article as recited in claim 1, wherein the aminosilane is bis (dimethylamino) dimethylsilane.

3. An article as recited in claim 1, configured as a semiconductor chip, a semiconductor chip carrier or a semiconductor wafer.

4. An article as recited in claim 1, wherein said surface in an external surface of said film.

5. An article as recited in claim 1, wherein said surface includes that of pores within said film.

6. An article of manufacture comprising:
   an insulating material having a plurality of electrical conductors formed therein;
   an intermetal dielectric including an organosilicate film having hydrogen atoms, alkyl or aryl groups attached to silicon atoms;

a surface of the organosilicate film comprising a product of a silylating agent and an organosilicate of said film, said silylating agent comprising an aminosilane having a general formula $(R_2N)_x SiR'_y$, where X and Y are integers from 3 to 2 and 1 to 2 respectively, and where R and R' are selected from the group consisting of hydrogen, alkyl, aryl, allyl, phenyl and a vinyl moiety.

7. An article of manufacture comprising:

an insulating material having a plurality of electrical conductors formed therein;

an intermetal dielectric including an organosilicate film having hydrogen atoms, alkyl or aryl groups attached to silicon atoms;

a surface of the organosilicate film comprising a product of a silylating agent and an organosilicate film, the silylating agent having the general formula $R_xH_ySi_zA$ where x, and Y are integers from 0 to 5, 6 to 1, and z is 2, respectively and where R is a hydrogen, alkyl, aryl, allyl, phenyl or vinyl moiety, and A is a silazane.

8. An article of manufacture comprising:

an insulating material having a plurality of electrical conductors formed therein; and an intermetal dielectric including an organosilicate film having hydrogen atoms or alkyl or aryl groups attached to silicon atoms;

a surface of the organosilicate film comprising a product of reaction with an aminosilane silylating agent and an organosilicate of said film and said silylating agent has the form $R_xH_ySi\text{-}A$ where X and Y are integers from 0 to 2 and 3 to 1, respectively and where R, is any hydrogen, alkyl, aryl, allyl, phenyl or vinyl moiety and where A is a chloro or alkoxy moiety.

* * * * *